United States Patent [19]

Arnold

[11] 4,065,588

[45] Dec. 27, 1977

[54] METHOD OF MAKING GOLD-COBALT CONTACT FOR SILICON DEVICES

[75] Inventor: Anthony Francis Arnold, Ringoes, N.J.

[73] Assignee: RCA Corporation, New York, N.Y.

[21] Appl. No.: 633,696

[22] Filed: Nov. 20, 1975

[51] Int. Cl.² ............... H01L 29/46; B32B 15/04; H01L 21/283

[52] U.S. Cl. .................. 427/89; 427/91; 427/125; 427/383 C; 427/377; 357/71; 29/589; 428/621; 428/672

[58] Field of Search ............ 427/89, 91, 125, 383 C, 427/377; 357/71; 428/450; 29/199, 195 S, 589

[56] References Cited

U.S. PATENT DOCUMENTS

| | | | |
|---|---|---|---|
| 3,300,340 | 1/1967 | Calandrello | 357/71 |
| 3,393,091 | 7/1968 | Hartmann | 357/71 |
| 3,597,665 | 8/1971 | Quetsch | 357/71 |
| 3,633,076 | 1/1972 | Arndt | 357/71 |
| 3,657,611 | 4/1972 | Yoneda | 357/71 |
| 3,662,454 | 5/1972 | Miller | 357/71 |
| 3,711,325 | 1/1973 | Hentzschel | 106/1 |
| 3,715,234 | 2/1973 | Stott | 427/89 |
| 3,729,807 | 5/1973 | Fujiwara | 427/89 |
| 3,850,688 | 11/1974 | Halt | 427/89 |
| 3,982,908 | 9/1976 | Arnold | 29/199 |

FOREIGN PATENT DOCUMENTS

| | | | |
|---|---|---|---|
| 1,587,273 | 2/1970 | France | 29/195 S |

*Primary Examiner*—Ralph S. Kendall
*Assistant Examiner*—John D. Smith
*Attorney, Agent, or Firm*—H. Christoffersen; Birgit E. Morris; Joseph T. Harcarik

[57] ABSTRACT

A contact for a silicon device comprises a layer of gold on the silicon, and a layer of cobalt on the gold layer. The contact is made by depositing gold on the silicon, depositing cobalt on the gold and heating the structure at a temperature between about 300° and about 370° C in a reducing gas atmosphere.

2 Claims, 2 Drawing Figures

METHOD OF MAKING GOLD-COBALT CONTACT FOR SILICON DEVICES

BACKGROUND OF THE INVENTION

The present invention relates to an ohmic contact to a silicon device and more particularly to a plated ohmic contact in which gold is the first layer on the silicon. The present invention also relates to a reproducible low temperature method of forming a gold-silicon bond.

Ohmic contacts to semiconductor devices must be made from a metal or layers of metal to which thermal or electrical leads can be soldered. However, in order to make a mechanically strong contact, the contact must be strongly bonded to the semiconductor device. A strong bond between metal and semiconductor is commonly achieved by heating the metal until it alloys with the underlying semiconductor.

U.S. Pat. No. 3,711,325 discloses the plating of a silicon device with a thin gold film, then plating a layer of nickel on the gold film. To achieve satisfactory bonding between the gold and the silicon, the composite structure must be sintered at a temperature above 370° C. However, such high temperature may adversely affect other parts of the silicon device, which may have other contacts, e.g. aluminum.

U.S. Pat. No. 3,753,774 discloses a method of making an intermetallic compound. A metal, such as gold, is plated on a semiconductor, such as silicon, and is then sintered at a temperature between 400° and 900° C. Again the drawback of this method is the use of high temperature to achieve satisfactory bonding between the gold and the silicon.

SUMMARY OF THE INVENTION

A contact to a silicon device comprises a layer of gold on a silicon body, and a layer of cobalt on the layer of gold. The contact to the silicon device is made by depositing a layer of gold on the silicon, depositing a layer of cobalt on the gold and heating the structure to a temperature between about 300° and about 370° C, to strengthen the gold-silicon bond.

DETAILED DESCRIPTION OF THE INVENTION

Figure 1:
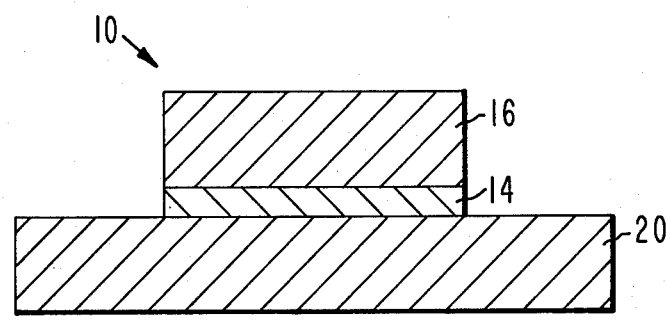
FIG. 1 is a cross-sectional view of a contact of the present invention on a silicon body.

Referring to FIG. 1, there is shown a contact of the present invention, generally designated as 10, on a silicon body 12. The contact 10 comprises a layer of gold 14 directly on the silicon body 12, and a layer of cobalt 16 directly on the gold layer 14.

The contact 10 is formed by depositing the layer of gold 14 directly on the silicon body 12, depositing the layer of cobalt 16 directly on the layer of gold 14 and heating the plated structure to a temperature between about 300° and about 370° C in a reducing atmosphere.

The layer of gold 14 can be deposited on the silicon body 12 by well-known conventional plating processes. Once the gold layer 14 is plated on the silicon body 12 to the desired thickness, the gold-plated silicon body is transferred immediately from the gold plating solution to the cobalt plating solution with minimal rinsing and without exposure to air or other oxidizing atmosphere, in order to avoid the possibility of oxide formation on the silicon body 12. The underlying silicon body 12 can be oxidized, even though there is a layer of gold 14 over it, because a thin layer of gold is porous to oxygen. The cobalt is plated on the gold by a conventional plating process, until the desired thickness is achieved. The plated silicon body is heated to a temperature between about 300° and about 370° C in a reducing atmosphere, such as 90% $N_2$ and 10% $H_2$ for about 10 minutes, to strengthen the gold-silicon bond. Varying the amount of time and temperature of heating the gold-silicon bond will vary the extent to which gold is diffused into the silicon.

The advantage of the present invention lies in the low temperature required to form the gold-silicon bond. In the prior art, the bond of gold to silicon was strengthened by heating the composite structure above 370° C, which is the gold-silicon eutectic temperature, i.e. the temperature at which gold would diffuse into the silicon to form an alloy with silicon. However, I have found that gold would diffuse into silicon at a temperature lower than the previously found eutectic temperature—provided that the silicon is not exposed to air or other oxidizing atmosphere. The silicon can be oxidized even though there is a layer of gold plated on it because the layer of gold is thin and is not evenly deposited on the silicon. It is believed that the presence of $SiO_2$ is what usually makes it necessary to exceed the eutectic temperature to form a gold-silicon bond. Thus, the plating of cobalt over the gold serves to cover the entire silicon body and to prevent oxidation of any portion of the silicon body. The layer of cobalt is relatively thick; therefore, it acts as a barrier to prevent the oxidation of the silicon. Cobalt is also generally less granular than plated gold. Moreover, cobalt plated over gold forms a naturally strong chemical bond with the gold, thereby obviating the need for further processing to strengthen the cobalt-gold bond. Thus a mechanically strong contact is made by merely strengthening the gold-silicon bond. Low temperature heating has the advantage of not adversely affecting other parts of the silicon body, which may have other contacts which are sensitive to high temperature, e.g. aluminum. The contact made by the method of the present invention is useful when electrical or thermal leads are desired to be attached to the silicon body.

As indicated earlier, the layer of gold 14 is fairly thin, on the order of 1 Å to 150 Å in thickness; the layer of cobalt 16 is relatively thick, on the order of 300 Å to 10,000 Å in thickness. Since the amount of the gold layer 14 diffused into the silicon body 12 is determined by the time and temperature of the heating process, the minimum thickness of the gold layer 14 would be determined by the amount needed for diffusion into the silicon body 12. As noted heretofore, the function of the cobalt layer 16 is to cover the gold layer 14 and the silicon body 12 to prevent oxidation of any portion of the silicon body 12. Since silicon bodies have a wide range of surface roughness, the amount of cobalt or the thickness required to completely cover the silicon body would be influenced by the surface roughness of the silicon body 12.

Figure 2:
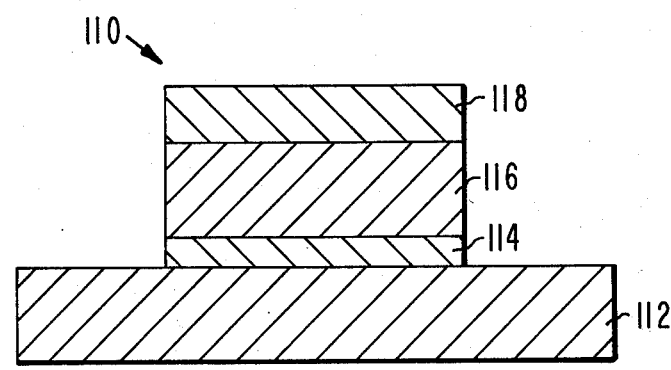
FIG. 2 is a cross-sectional view of another contact of the present invention on a silicon body.

Many soldering operations are more efficiently performed on a nickel surface than on a cobalt surface. Referring to FIG. 2, there is shown a cross-sectional view of another contact of the present invention, generally designated as 110 on a silicon body 112. The contact 110 is similar to the contact 10 of FIG. 1, except with the addition of a layer of nickel on the cobalt. The contact 110 comprises a layer of gold 114 on the silicon body 112. A layer of cobalt 116 is on the gold layer 114 and a layer of nickel 118 is on the cobalt layer 116. The nickel layer 118 is between about 200 A and about 800 A in thickness.

The contact 110 is made in a manner similar to the contact 10 of FIG. 1, with respect to applying the gold layer 114, and the cobalt layer 116. The layer of nickel 118 can be plated on the layer of cobalt 116 by any well-known conventional plating process. The advantages of the contact 10 of FIG. 1 are, of course, also present in the contact 110 of FIG. 2. This embodiment has the advantage that the layer of cobalt 116 also serves as a barrier to prevent the diffusion of the nickel layer 118 to the gold layer 114 during a subsequent soldering operation.

What is claimed is:

1. A method of making a contact to a silicon body comprising:

depositing a layer of gold directly on said silicon body;

depositing a layer of cobalt directly on said layer of gold without intermediate exposure to oxygen; and heating said deposited silicon body to a temperature between about 300° and about 370° C in a reducing atmosphere.

2. The method of making a contact of claim 1, wherein said method further includes depositing a layer of nickel directly on said layer of cobalt.